(12) United States Patent
Yamazaki

(10) Patent No.: US 9,456,161 B2
(45) Date of Patent: Sep. 27, 2016

(54) PHOTOELECTRIC CONVERSION APPARATUS, IMAGE PICKUP SYSTEM, AND DRIVING METHOD OF THE PHOTOELECTRIC CONVERSION APPARATUS

(71) Applicant: CANON KABUSHIKI KAISHA, Tokyo (JP)

(72) Inventor: Kazuo Yamazaki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/930,510

(22) Filed: Nov. 2, 2015

(65) Prior Publication Data

US 2016/0127669 A1 May 5, 2016

(30) Foreign Application Priority Data

Nov. 4, 2014 (JP) ................................. 2014-224750

(51) Int. Cl.
| | |
|---|---|
| H04N 5/378 | (2011.01) |
| H04N 5/376 | (2011.01) |
| H04N 5/225 | (2006.01) |
| H04N 5/3745 | (2011.01) |
| H04N 5/232 | (2006.01) |
| H01L 27/146 | (2006.01) |

(52) U.S. Cl.
CPC ........ *H04N 5/378* (2013.01); *H01L 27/14641* (2013.01); *H04N 5/2254* (2013.01); *H04N 5/3765* (2013.01); *H04N 5/37457* (2013.01); *H04N 5/23212* (2013.01)

(58) Field of Classification Search
None
See application file for complete search history.

(56) References Cited

U.S. PATENT DOCUMENTS

| | | | | |
|---|---|---|---|---|
| 8,212,905 | B2 * | 7/2012 | Noda | H04N 5/3598 348/241 |
| 8,928,791 | B2 * | 1/2015 | Okita | H04N 5/335 250/208.1 |
| 9,094,624 | B2 * | 7/2015 | Shimotsusa | H01L 27/14627 |
| 9,154,685 | B2 * | 10/2015 | Masuyama | H04N 5/23212 |
| 9,204,030 | B2 * | 12/2015 | Okita | H04N 5/23212 |
| 9,224,771 | B2 * | 12/2015 | Yamashita | H01L 27/14609 |
| 9,225,923 | B2 * | 12/2015 | Hashimoto | H04N 5/3696 |
| 9,232,164 | B2 * | 1/2016 | Minowa | H04N 5/37457 |
| 9,312,291 | B2 * | 4/2016 | Tatani | H01L 27/14603 |

(Continued)

FOREIGN PATENT DOCUMENTS

JP 2013-211833 A 10/2013

*Primary Examiner* — Michael Osinski
(74) *Attorney, Agent, or Firm* — Canon USA, Inc. IP Division

(57) ABSTRACT

An apparatus including pixels, each having first and second photoelectric conversion elements, an amplifying unit, first and second transfer gates, and a microlens, performs, in one pixel, a first operation involving turning on the first transfer gate, outputting a signal based on charge generated in the first photoelectric conversion element, turning on the first and second transfer gates while retaining the charge generated and transferred to an input node, and outputting a signal based on charges generated in the first and second photoelectric conversion elements, and, in another pixel, a second operation involving turning on the first transfer gate, not outputting a signal based on charge generated in the first photoelectric conversion element, turning on the first and second transfer gates while retaining the charge generated and transferred to the input node, and outputting a signal based on charges generated in the first and second photoelectric conversion elements.

20 Claims, 10 Drawing Sheets

(56) References Cited

U.S. PATENT DOCUMENTS

| | | | |
|---|---|---|---|
| 2009/0090845 A1* | 4/2009 | Yin | H01L 27/14603 250/208.1 |
| 2010/0149366 A1* | 6/2010 | Noda | H04N 5/3598 348/222.1 |
| 2011/0001861 A1* | 1/2011 | Tanaka | H01L 27/14603 348/300 |
| 2011/0073923 A1* | 3/2011 | Tatani | H01L 27/14603 257/291 |
| 2011/0273597 A1* | 11/2011 | Ishiwata | H01L 27/14603 348/272 |
| 2012/0327281 A1* | 12/2012 | Mabuchi | H04N 5/343 348/302 |
| 2013/0076972 A1* | 3/2013 | Okita | H04N 5/23212 348/360 |
| 2013/0107087 A1* | 5/2013 | Okada | H04N 5/365 348/280 |
| 2013/0120624 A1* | 5/2013 | Okita | H04N 5/335 348/300 |
| 2013/0194471 A1* | 8/2013 | Yamashita | H04N 5/374 348/308 |
| 2013/0214128 A1* | 8/2013 | Yamashita | H01L 27/14609 250/208.1 |
| 2013/0229555 A1* | 9/2013 | Hashimoto | H04N 5/3696 348/300 |
| 2014/0036121 A1* | 2/2014 | Minowa | H04N 5/378 348/301 |
| 2014/0063329 A1* | 3/2014 | Masuyama | H04N 5/23241 348/349 |
| 2014/0146208 A1* | 5/2014 | Nakajima | H04N 5/3696 348/294 |
| 2014/0166860 A1* | 6/2014 | Konishi | H01L 27/14614 250/208.1 |
| 2014/0340541 A1* | 11/2014 | Shimotsusa | H01L 27/14627 348/222.1 |
| 2014/0340555 A1* | 11/2014 | Iwane | H04N 5/343 348/308 |
| 2015/0163426 A1* | 6/2015 | Ohshitanai | H04N 5/3696 348/322 |
| 2015/0357365 A1* | 12/2015 | Kimura | H01L 27/14643 257/225 |
| 2015/0358566 A1* | 12/2015 | Washizu | G02B 13/0015 348/322 |
| 2016/0043119 A1* | 2/2016 | Lee | H01L 27/14603 250/208.1 |
| 2016/0105623 A1* | 4/2016 | Ikedo | H04N 5/378 348/320 |

* cited by examiner

FIG. 3

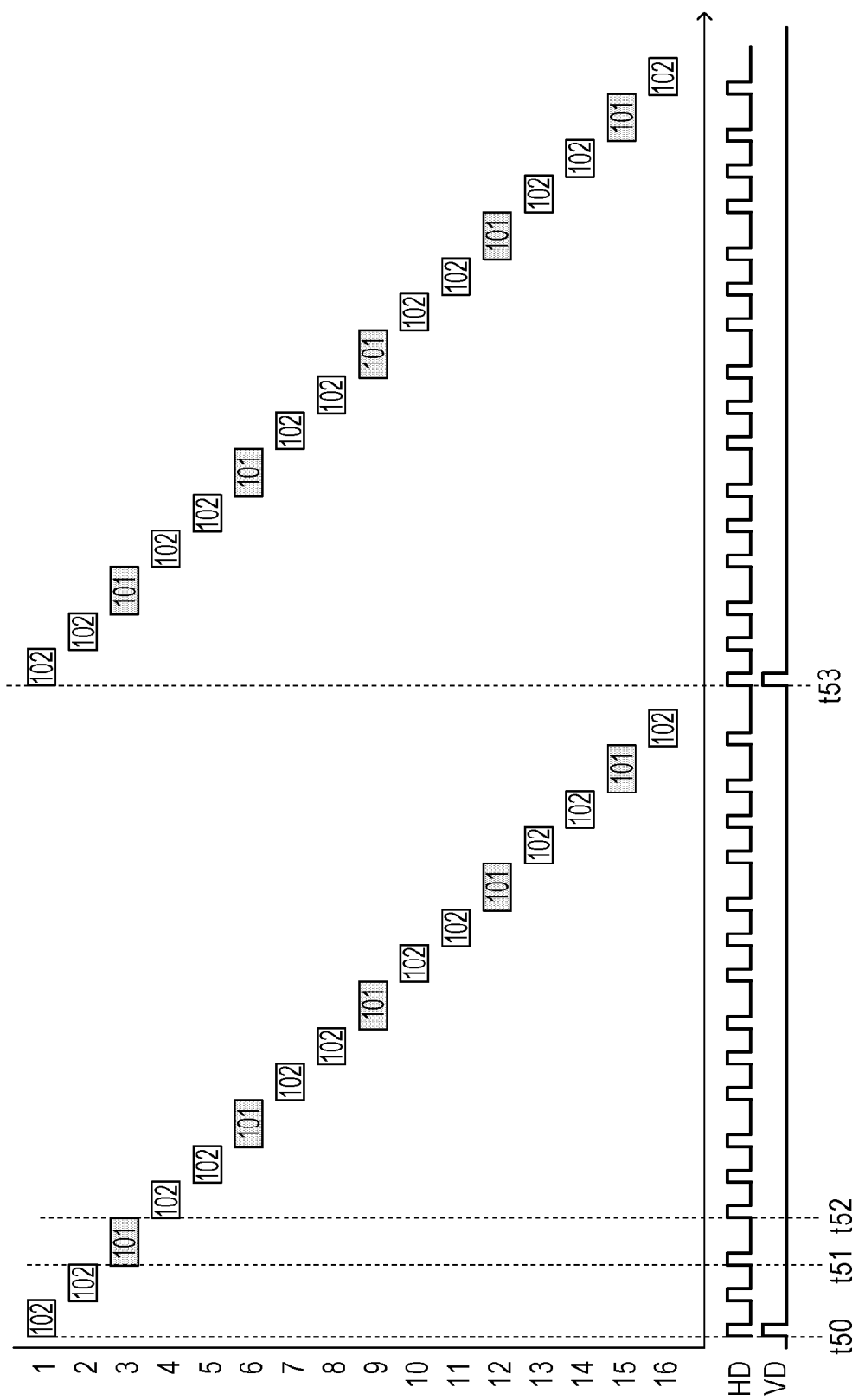

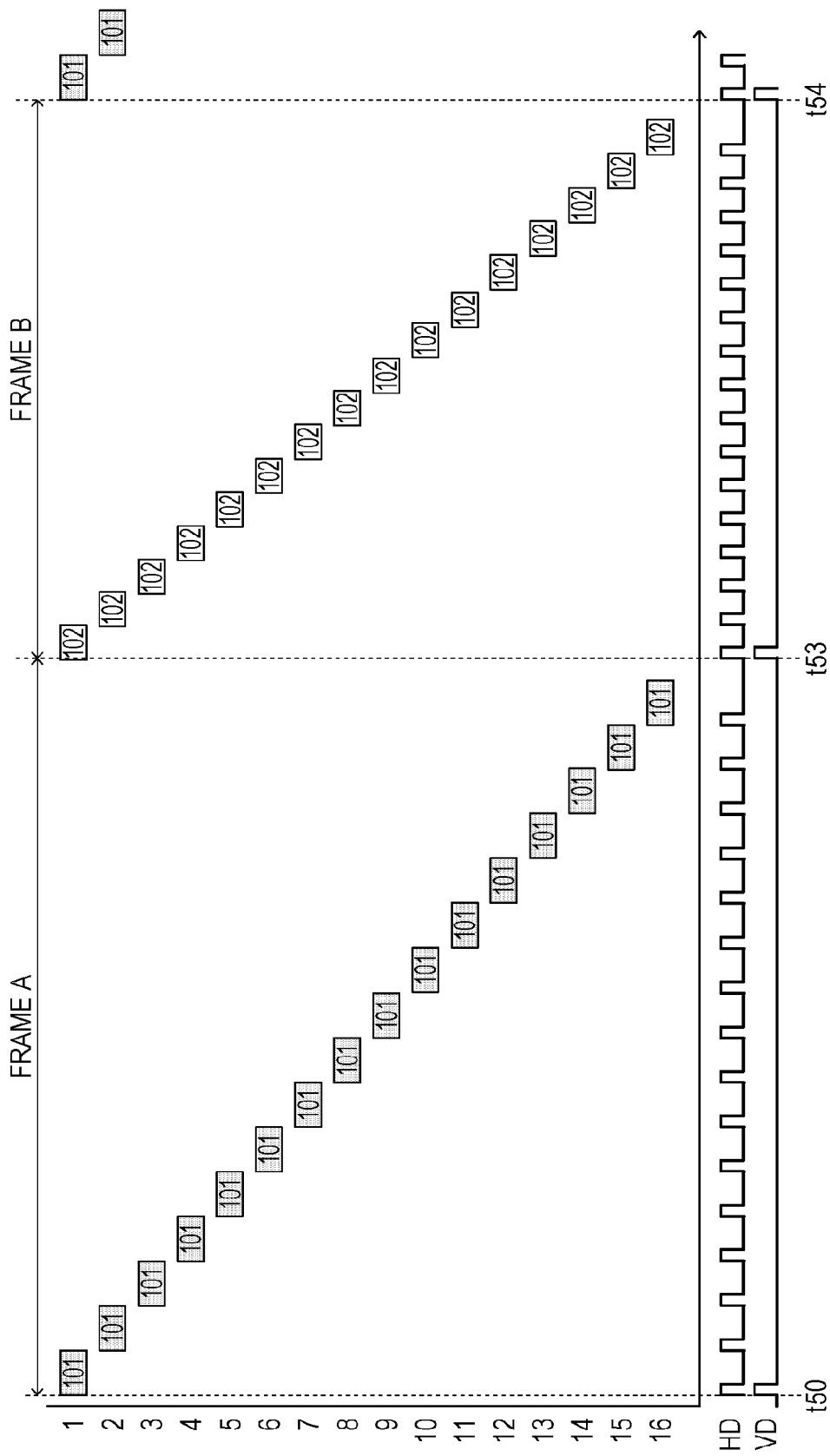

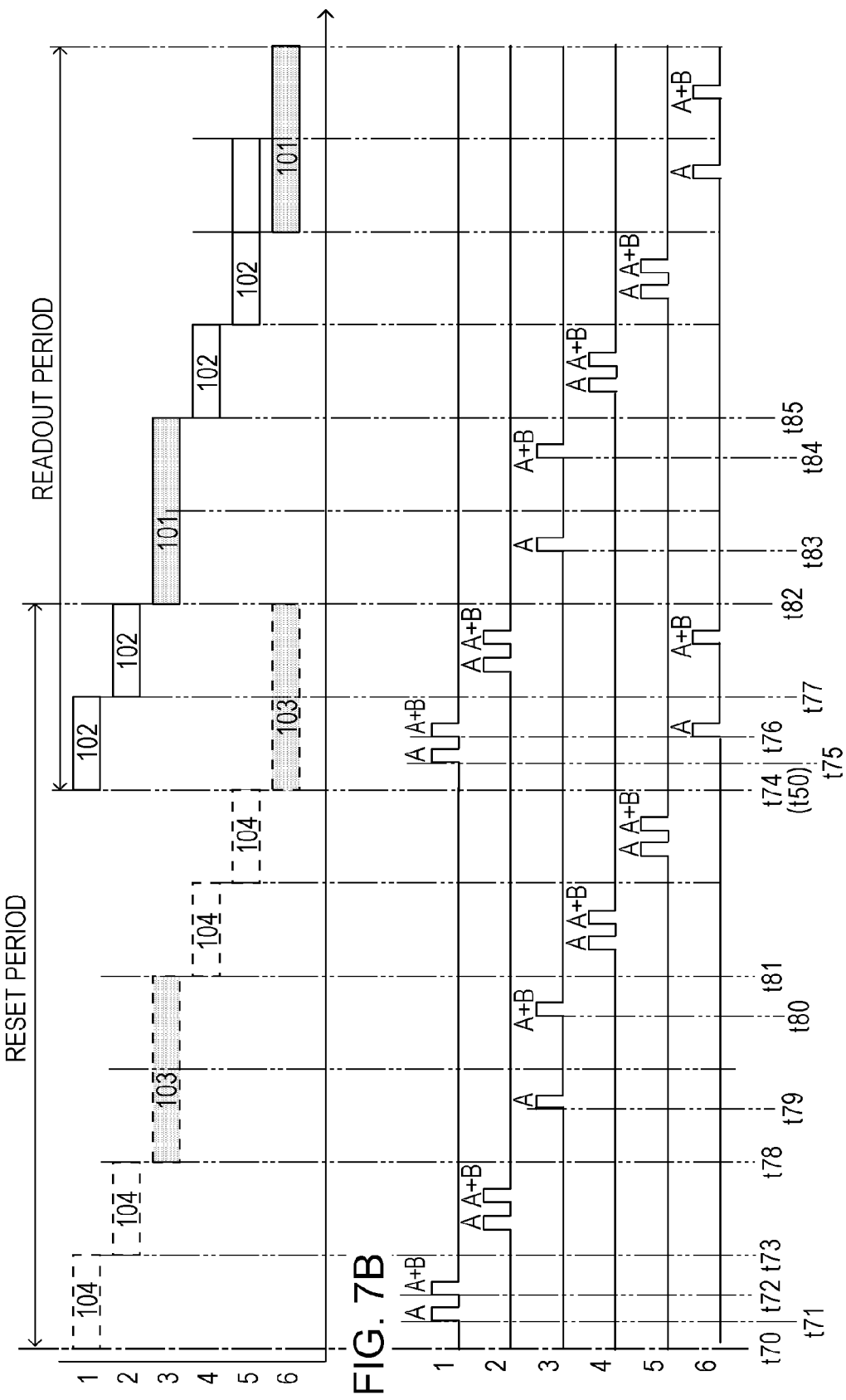

PHOTOELECTRIC CONVERSION APPARATUS, IMAGE PICKUP SYSTEM, AND DRIVING METHOD OF THE PHOTOELECTRIC CONVERSION APPARATUS

BACKGROUND OF THE INVENTION

1. Field of the Invention

The present invention relates to a photoelectric conversion apparatus, an image pickup system, and a driving method of the photoelectric conversion apparatus.

2. Description of the Related Art

As a photoelectric conversion apparatus configured to output signals that can be used for focus detection by a phase difference detection method, a photoelectric conversion apparatus having pixels, each including a microlens and a pair of photoelectric conversion elements corresponding thereto, has been proposed.

In such a photoelectric conversion apparatus described in Japanese Patent Laid-Open No. 2013-211833, a region for acquiring both focus detection information and image information and a region for acquiring only image information are defined. From each pixel in the region for acquiring both focus detection information and image information, a signal (signal A) based on only one of photoelectric conversion elements in a pair and a signal (signal A+B) based on charges generated in both the photoelectric conversion elements, are read out. From each pixel in the region for acquiring only image information, only the signal A+B is read out (i.e., the signal A is not read out) to shorten the readout time.

In the two signals A+B described in Japanese Patent Laid-Open No. 2013-211833, there may be variation between signals for an image (image signals) due to a difference in transfer characteristics or the amount of produced noise, caused by a difference in readout method.

SUMMARY OF THE INVENTION

A photoelectric conversion apparatus according to an aspect of the present invention includes a first pixel and a second pixel, each having a first photoelectric conversion element, a second photoelectric conversion element, an amplifying unit having an input node and configured to read out a signal based on charges generated in the first photoelectric conversion element and the second photoelectric conversion element, a first transfer gate configured to transfer the charge generated in the first photoelectric conversion element to the input node, a second transfer gate configured to transfer the charge generated in the second photoelectric conversion element to the input node, and a microlens configured to condense incident light onto the first photoelectric conversion element and the second photoelectric conversion element. The photoelectric conversion apparatus performs a first operation in which, in the first pixel, the first transfer gate is turned on to transfer the charge generated in the first photoelectric conversion element to the input node, a signal based on the charge generated in the first photoelectric conversion element is output from the photoelectric conversion apparatus, the first transfer gate and the second transfer gate are turned on while the charge generated in the first photoelectric conversion element and transferred to the input node is retained in the input node to transfer the charges generated in the first photoelectric conversion element and the second photoelectric conversion element to the input node, and a signal based on the charges generated in the first photoelectric conversion element and the second photoelectric conversion element is output from the photoelectric conversion apparatus; and a second operation in which, in the second pixel, the first transfer gate is turned on to transfer the charge generated in the first photoelectric conversion element to the input node, a signal based on the charge generated in the first photoelectric conversion element is not output from the photoelectric conversion apparatus, the first transfer gate and the second transfer gate are turned on while the charge generated in the first photoelectric conversion element and transferred to the input node is retained in the input node to transfer the charges generated in the first photoelectric conversion element and the second photoelectric conversion element to the input node, and a signal based on the charges generated in the first photoelectric conversion element and the second photoelectric conversion element is output from the photoelectric conversion apparatus.

Further features of the present invention will become apparent from the following description of exemplary embodiments with reference to the attached drawings.

BRIEF DESCRIPTION OF THE DRAWINGS

FIG. 3 schematically illustrates a pixel array in the photoelectric conversion apparatus according to the first embodiment.

FIG. 4 is a timing chart illustrating a driving method of the photoelectric conversion apparatus according to the first embodiment.

FIG. 6 is a timing chart illustrating a driving method of the photoelectric conversion apparatus according to a second embodiment.

FIGS. 7A and 7B are timing charts illustrating a driving method of the photoelectric conversion apparatus according to a third embodiment.

DESCRIPTION OF THE EMBODIMENTS

Figure 1:
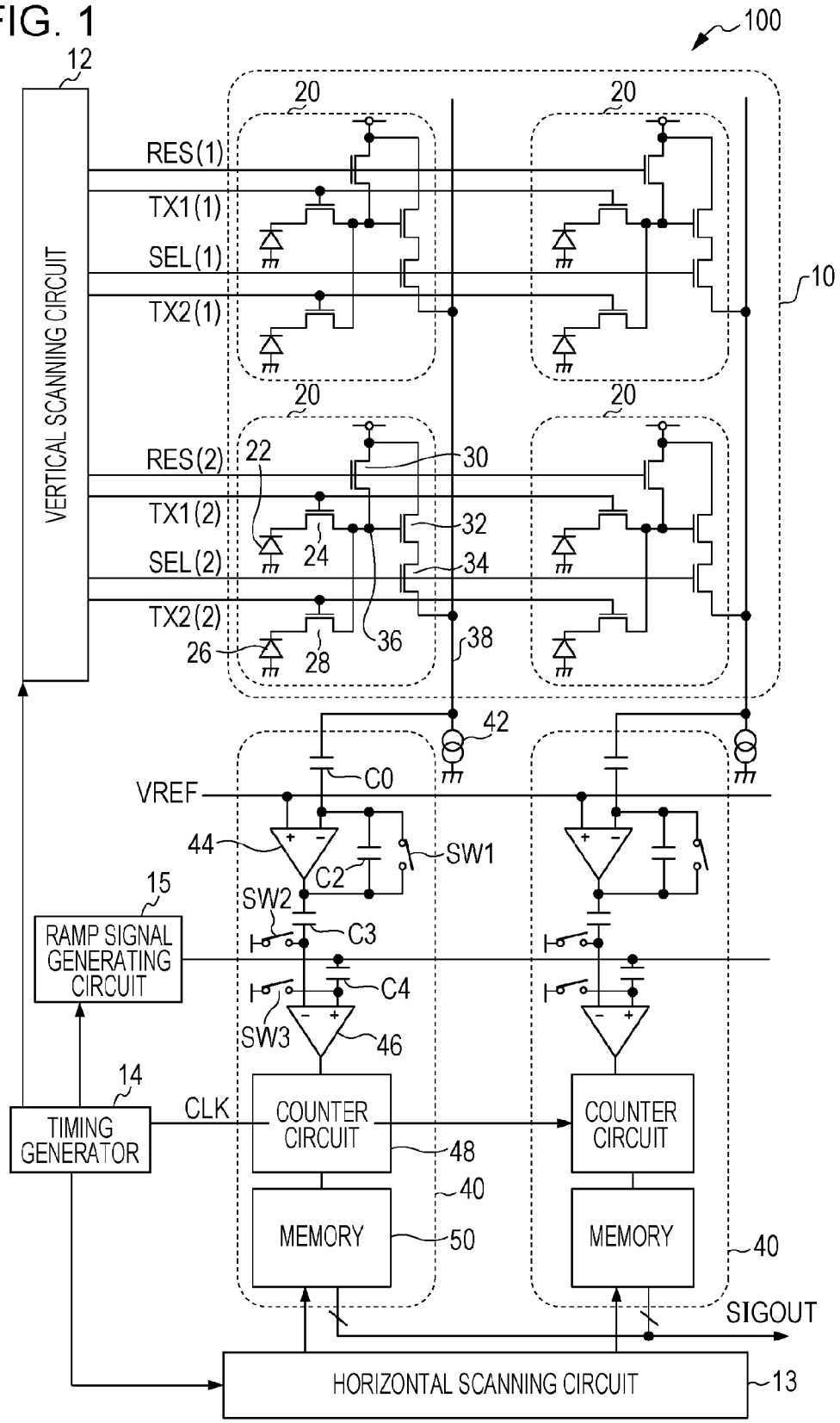
FIG. 1 is a circuit diagram schematically illustrating a configuration of a photoelectric conversion apparatus according to a first embodiment.

The following embodiments are described about a photoelectric conversion apparatus and a driving method of the photoelectric conversion apparatus that can reduce variation between image signals acquired by two different readout methods.

In a photoelectric conversion apparatus according to the present invention, each of a plurality of pixels includes first and second photoelectric conversion elements, first and second transfer gates for transferring charges of the first and second photoelectric conversion elements, an amplifying unit having an input node, and a microlens configured to condense incident light onto the first and second photoelectric conversion elements. The photoelectric conversion apparatus according to the present invention has a first operation and a second operation that perform different readout methods. The first operation involves reading out, from one of the pixels, a first signal based on the charge of the first photoelectric conversion element, and a second signal based on the charges of the first and second photoelectric conversion elements. The second operation involves reading out, from another of the pixels, the second signal based on the charges of the first and second photoelectric conversion elements. That is, the first operation performs a first readout method, and the second operation performs a second readout method different from the first readout method.

In the first operation, after the first transfer gate is turned on and the first signal is read out, the first transfer gate and the second transfer gate are turned on and the second signal is read out from the pixel while the charge generated in the first photoelectric conversion element and transferred to the input node is retained. In the second operation, after the first transfer gate is turned on, the first transfer gate and the second transfer gate are turned on and the second signal is read out while the charge generated in the first photoelectric conversion element and transferred to the input node is retained.

With the operations described above, in either of the readout methods, the charge of the first photoelectric conversion element is retained in the input node when the second signal is read out. Therefore, the conditions of transfer operations for reading out the second signals in the two readout methods can be brought close to each other. The conditions of transfer operations refer to, for example, the potential of a floating diffusion region (hereinafter referred to as FD region) in transferring the charge, the total number of times the transfer gates are turned on, and the length of time during which the transfer gates are on. With the technique described above, it is possible to reduce variation between image signals acquired by two different readout methods. Reading out means to output the first signal and the second signal from the pixel and make them available for use.

A photoelectric conversion apparatus according to the present invention will now be described using embodiments. The embodiments can be modified or combined as necessary.

First Embodiment

A photoelectric conversion apparatus and a driving method of the photoelectric conversion apparatus according to a first embodiment will be described with reference to FIG. 1 to FIGS. 5A and 5B. In the drawings, the same components or signals are denoted by the same reference numerals, and their description may be omitted. First, a general configuration of the photoelectric conversion apparatus according to the first embodiment will be described with reference to FIG. 1. FIG. 1 is a circuit diagram schematically illustrating a configuration of the photoelectric conversion apparatus.

A photoelectric conversion apparatus 100 includes a pixel array 10, signal processing circuits 40, a vertical scanning circuit 12, a horizontal scanning circuit 13, a timing generator (hereinafter referred to as TG) 14, and a ramp signal generating circuit 15.

The pixel array 10 has a plurality of pixels 20 arranged in a two-dimensional matrix in row and column directions. FIG. 1 illustrates the pixel array 10 of two rows and two columns for simplification, but the number of pixels 20 arranged in the row and column directions is not particularly limited. Each of the pixels 20 includes a plurality of photoelectric conversion elements and a plurality of transfer gates. For example, the photoelectric conversion elements correspond to the respective transfer gates. For example, the photoelectric conversion elements are photodiodes (hereinafter referred to as PDs) 22 and 26, and the transfer gates are the gates of transfer transistors 24 and 28. Each of the pixels 20 further includes a reset transistor 30, an amplifying transistor 32, and a selection transistor 34, but the configuration is not limited to this. For example, the pixel 20 may not necessarily include the selection transistor 34, and may include a capacitance retaining a charge or a switch for connecting an FD region 36 of an adjacent pixel. The amplifying transistor 32 may also be referred to as an amplifying unit, and the reset transistor 30 may also be referred to as a reset unit. Each of the transistors is, for example, a metal oxide semiconductor (MOS) transistor.

The anode of the PD 22 forming the first photoelectric conversion element is connected to a ground voltage line, and the cathode of the PD 22 is connected to the source of the transfer transistor 24. The anode of the PD 26 forming the second photoelectric conversion element is connected to the ground voltage line, and the cathode of the PD 26 is connected to the source of the transfer transistor 28. The drains of the transfer transistors 24 and 28 are connected to the source of the reset transistor 30 and the gate of the amplifying transistor 32. A connection node of the drains of the transfer transistors 24 and 28, the source of the reset transistor 30, and the gate of the amplifying transistor 32 forms the FD region 36. The connection node may be referred to as an input node of the amplifying unit. The drains of the reset transistor 30 and amplifying transistor 32 are connected to a supply voltage line. The source of the amplifying transistor 32 is connected to the drain of the selection transistor 34. The transfer transistors 24 and 28, the reset transistor 30, the amplifying transistor 32, and the selection transistor 34 form a pixel readout unit for reading out a signal based on charges generated in the PDs 22 and 26. The readout unit may include at least the amplifying transistor 32.

Referring to FIG. 1, each row of the pixel array 10 has a signal line TX1, a signal line TX2, a signal line RES, and a signal line SEL extending in the row direction. The signal line TX1 is connected to the gates of the transfer transistors 24 in the pixels 20 arranged in the row direction, and the signal line TX2 is connected to the gates of the transfer transistors 28 in the pixels 20 arranged in the row direction. The signal line RES is connected to the gates of the reset transistors 30 of the pixels 20 arranged in the row direction, and the signal line SEL is connected to the gates of the selection transistors 34 in the pixels 20 arranged in the row direction. The signal lines TX1, TX2, RES, and SEL are each a single signal line common to the transistors of the pixels 20 in each row. In FIG. 1, a number corresponding to the row number is added to the name of each signal line. That is, the signal lines in the N-th row are denoted by RES(N), SEL(N), TX1(N), and TX2(N), and the signal lines in the first row are denoted by RES(1), SEL(1), TX1(1), and TX2(1).

In accordance with a timing signal from the TG 14, the vertical scanning circuit 12 selects the pixels 20 on a row-by-row basis to cause the pixels 20 to output signals.

The signal lines TX, RES, and SEL are connected to the vertical scanning circuit 12. Control signals for driving the transfer transistors 24 and 28 are supplied from the vertical scanning circuit 12 to the signal lines TX1 and TX2. Control signals for driving the reset transistors 30 are supplied from the vertical scanning circuit 12 to the signal lines RES. Control signals for driving the selection transistors 34 are supplied from the vertical scanning circuit 12 to the signal lines SEL.

Each column of the pixel array 10 has a vertical signal line 38 extending in the column direction. The vertical signal line 38 is connected to the sources of the selection transistors 34 in the pixels 20 arranged in the column direction, and is common to the pixels 20 in each column. The signal processing circuit 40 and a current source 42 are connected to the vertical signal line 38 in each column. For example, the current source 42 may be a current source capable of switching the current value, or may be a constant current source. The current source 42 and the amplifying transistor 32 form a source follower circuit.

The signal processing circuit 40 is for processing signals output from the pixel array 10. The signal processing circuit 40 includes capacitors C0, C3, and C4 for a clamping operation, a capacitor C2 which is a feedback capacitor, switches SW1 to SW3, an operational amplifier 44, a comparator circuit 46, a counter circuit 48, and a memory 50. An inverting input terminal of the operational amplifier 44 is connected through the capacitor C0 to the vertical signal line 38. A reference voltage Vref is applied to a non-inverting input terminal of the operational amplifier 44. The capacitor C2 and the switch SW1 are connected in parallel between the inverting input terminal and an output terminal of the operational amplifier 44. The output terminal of the operational amplifier 44 is connected through the capacitor C3 to one of input terminals of the comparator circuit 46. The switch SW2 is connected between a connection node of the capacitor C3 and the comparator circuit 46 and a fixed voltage line (e.g., supply voltage line). The ramp signal generating circuit 15 is connected through the capacitor C4 to the other input terminal of the comparator circuit 46. The ramp signal generating circuit 15 is a circuit for generating ramp signals used in processing signals in the signal processing circuit 40 in accordance with a timing signal from the TG 14. The switch SW3 is connected between a connection node of the capacitor C4 and the comparator circuit 46 and a fixed voltage line (e.g., supply voltage line). A control signal for turning on or off each of the switches SW1 to SW3 is applied thereto from a signal line (not shown). The counter circuit 48 is connected to an output terminal of the comparator circuit 46. The TG 14 and the memory 50 are connected to the counter circuit 48. The horizontal scanning circuit 13 is connected to the memory 50.

Figure 2A:
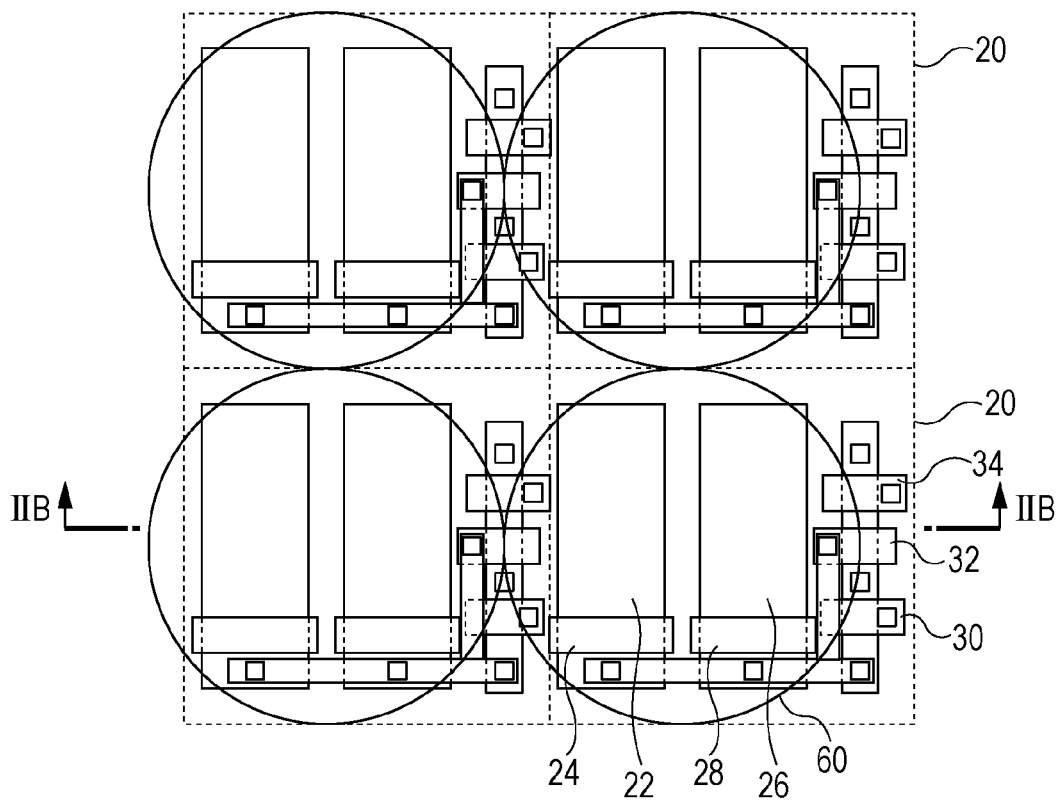
FIGS. 2A and 2B are a schematic plan view and a schematic cross-sectional view, respectively, of pixels in the photoelectric conversion apparatus according to the first embodiment.
Figure 2B:
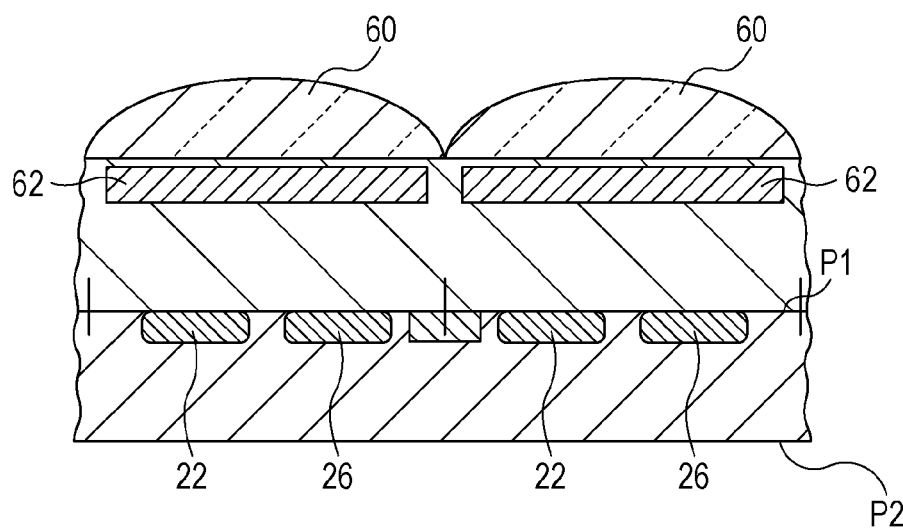

A structure of each pixel 20 will be described with reference to FIGS. 2A and 2B. FIG. 2A is a schematic plan view of pixels 20, and FIG. 2B is a schematic cross-sectional view of pixels 20. The same components as those in FIG. 1 are denoted by the same reference numerals and their description will be omitted.

FIG. 2A is a schematic plan view of the pixel array 10 including four pixels 20. The schematic plan view may be referred to as an orthogonal projection diagram obtained by projecting a structure onto a plane. FIG. 2B is a schematic cross-sectional view taken along line IIB-IIB of FIG. 2A. The pixel array 10 having the circuit configuration illustrated in FIG. 1 can be realized, for example, by a planar layout illustrated in FIG. 2A. Unit regions, each enclosed by a dotted line in FIG. 2A, represent pixels 20. A microlens (ML) 60 is provided for each of the pixels 20. That is, the photoelectric conversion apparatus 100 includes an ML array formed by a plurality of MLs 60. Each of the pixels 20 includes the PDs 22 and 26, and the transistors 24, 28, 30, 32, and 34 described above are provided to correspond to the PDs 22 and 26. Reference numerals 24, 28, 30, 32, and 34 in FIG. 2A denote the gates of the respective transistors 24, 28, 30, 32, and 34 in FIG. 1. A region adjacent to a gate is a source or drain. The FD region 36 is formed by connecting the drains of the transfer transistors 24 and 28, the gate of the amplifying transistor 32, and the source of the reset transistor 30 through contact plugs and wiring.

As illustrated in FIG. 2B, each pixel 20 has a color filter (monochromatic color filter) 62 corresponding to a single color between the ML 60 and the PDs 22 and 26. A surface P1 is a light receiving surface of the PDs 22 and 26. For example, the surface P1 is a surface of a silicon semiconductor substrate. A semiconductor wiring structure may be provided between the surface P1 and the color filter 62, or a wiring structure may be provided on a surface P2 on the opposite side of the surface P1.

A plurality of photoelectric conversion elements (i.e., the PDs 22 and 26 here) included in each pixel 20 will be collectively referred to as a "light receiving unit". Each ML 60 is disposed to cover one light receiving unit so as to condense light beams onto the light receiving unit. That is, one ML 60 corresponds to one light receiving unit. Light condensed by one ML 60 is incident on a plurality of photoelectric conversion elements of the light receiving unit corresponding to the one ML 60. Although the light receiving unit includes two photoelectric conversion elements in the first embodiment, it may include more photoelectric conversion elements.

A phase difference detection method will now be described. The photoelectric conversion apparatus 100 has a configuration in which one ML 60 is assigned to each light receiving unit. With this configuration, light passed through different regions in the pupil of an imaging lens can be detected by the plurality of photoelectric conversion elements. The imaging lens is a lens for forming an image of an object on an image pickup surface of the photoelectric conversion apparatus. The different regions in the pupil of the imaging lens are defined as a first region and a second region. Light passed through the first region is detected by the first photoelectric conversion element. A signal detected by the first photoelectric conversion element is defined as a signal A. Light passed through the second region is detected by the second photoelectric conversion element. A signal detected by the second photoelectric conversion element is defined as a signal B. The signals A from the respective pixels 20 form a first image, and the signals B from the respective pixels 20 form a second image. From the amount of shift between the first image and the second image, it is possible to detect the amount of deviation of an image formed by the imaging lens from the image pickup surface of the photoelectric conversion apparatus (i.e., the amount of defocus) or detect the distance to the object. This technique is referred to as a phase difference detection method. A signal obtained by adding up signals from all photoelectric conversion elements under one ML 60 is used as a normal image signal. In the present embodiment, a signal obtained by adding a signal detected by the first photoelectric conversion element to a signal detected by the second photoelectric conversion element (hereinafter referred to as signal A+B) is used as a normal image signal.

Figure 3:
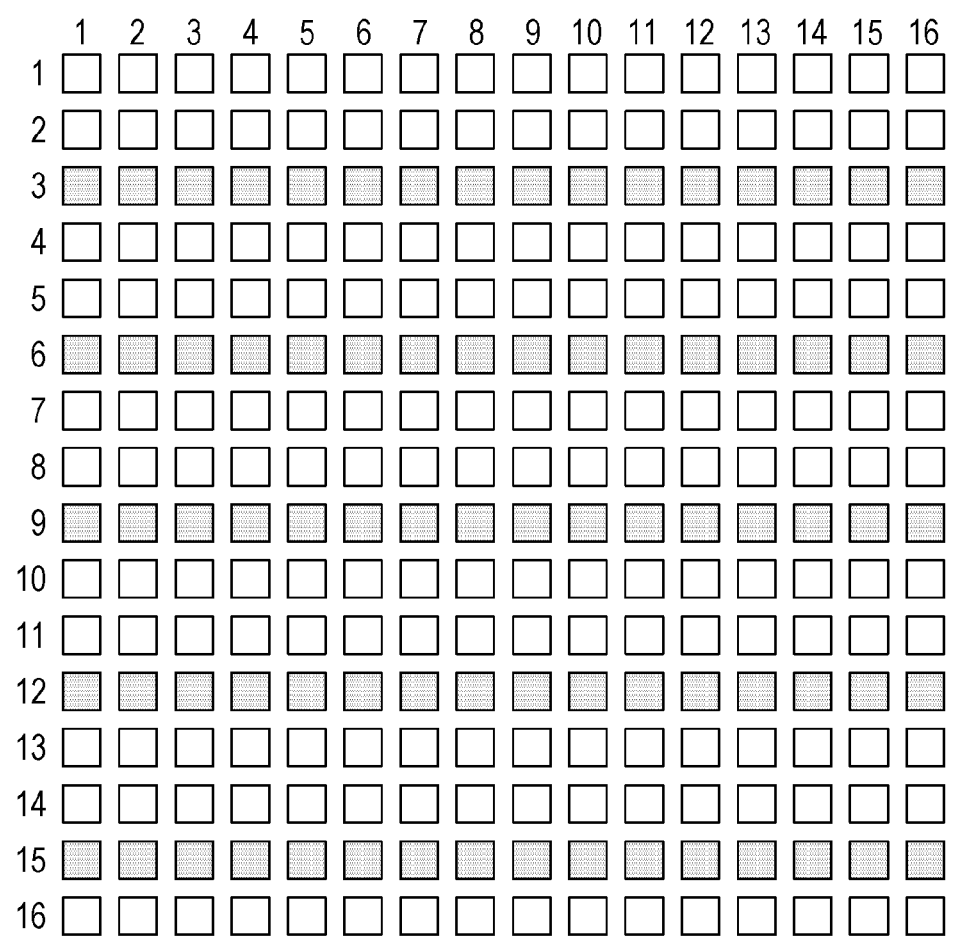

A driving method of the photoelectric conversion apparatus according to the first embodiment will now be described with reference to FIG. 3 to FIGS. 5A and 5B. First, two methods for driving the pixels 20 will be described with reference to FIGS. 3 and 4. FIG. 3 schematically illustrates the pixel array 10. FIG. 4 is a timing chart illustrating a driving method.

FIG. 3 schematically illustrates part of the pixel array 10. In FIG. 3, the pixels 20 are arranged in an array of 16 rows and 16 columns. Numbers arranged in the horizontal direction are column numbers, and numbers arranged in the vertical direction are row numbers. In FIG. 3, at least one pixel 20 for reading out a signal for focus detection (focus detection signal) is placed in each of the 3rd, 6th, 9th, 12th, and 15th rows. These rows are defined as pixel rows for focus detection. In the other rows, the pixels 20 for reading out signals for an image (image signals) are arranged. These rows are defined as pixel rows for an image. From each pixel 20 for reading out a focus detection signal, the signal A and the signal A+B are read out, and the signal B is acquired by subtracting the signal A from the signal A+B. From each pixel 20 for reading out an image signal, only the signal A+B is read out. That is, the two different readout methods in the present embodiment are a readout method for acquiring both focus detection and image signals (period 101) and a readout method for acquiring only image signals (period 102). An operation of the readout method for the period 101 is defined as a first operation, and an operation of the readout method for the period 102 is defined as a second operation. A step of performing the first operation is defined as a first step, and a step of performing the second operation is defined as a second step.

With reference to FIG. 4, a method for reading out focus detection and image signals from the corresponding pixels 20 will be described. FIG. 4 is a timing chart illustrating an operation sequence for each row in the pixel array 10. In FIG. 4, the horizontal axis represents time, and the vertical direction corresponds to row numbers in the pixel array 10 illustrated in FIG. 3. In FIG. 4, signals are read out sequentially from the 1st row to the 16th row under the control of a signal VD and a signal HD. The signal VD is referred to as a vertical synchronizing signal or frame identifying signal. Vertical scanning starts when the signal VD transitions to H level. A signal readout operation starts at the first row and proceeds to the next row. The signal HD is referred to as a horizontal synchronizing signal. When the signal HD transitions to H level, a signal readout operation for each row starts. When the signal HD transitions to H level again, the signal readout operation proceeds to the next row. For example, a signal readout operation for the first row starts when the signal HD transitions to H level at time t50, a signal readout operation for the third row starts when the signal HD transitions to H level at time t51, and a signal readout operation for the fourth row starts when the signal HD transitions to H level at time t52. In FIG. 4, there is no overlap between the periods 101 and 102, and signals are read out sequentially. The period from time t50 at which the signal VD transitions to H level to time t53 at which the signal VD transitions to H level again is one vertical scanning period, which is also referred to as one frame. If the method for reading out the signal A+B for the image in the period 101 differs from the method for reading out the signal A+B for the image in the period 102 and the conditions of their transfer operations are different, the resulting difference in the amount of superimposed noise causes horizontal stripes to appear in the image. Specifically, the conditions of their transfer operations refer to the total number of times the transfer transistors 24 and 28 and the reset transistor 30 are driven, the total number of times the transfer gates are turned on and off, the length of time during which the transfer gates are on, and the potential of the FD region 36.

Figure 5A:
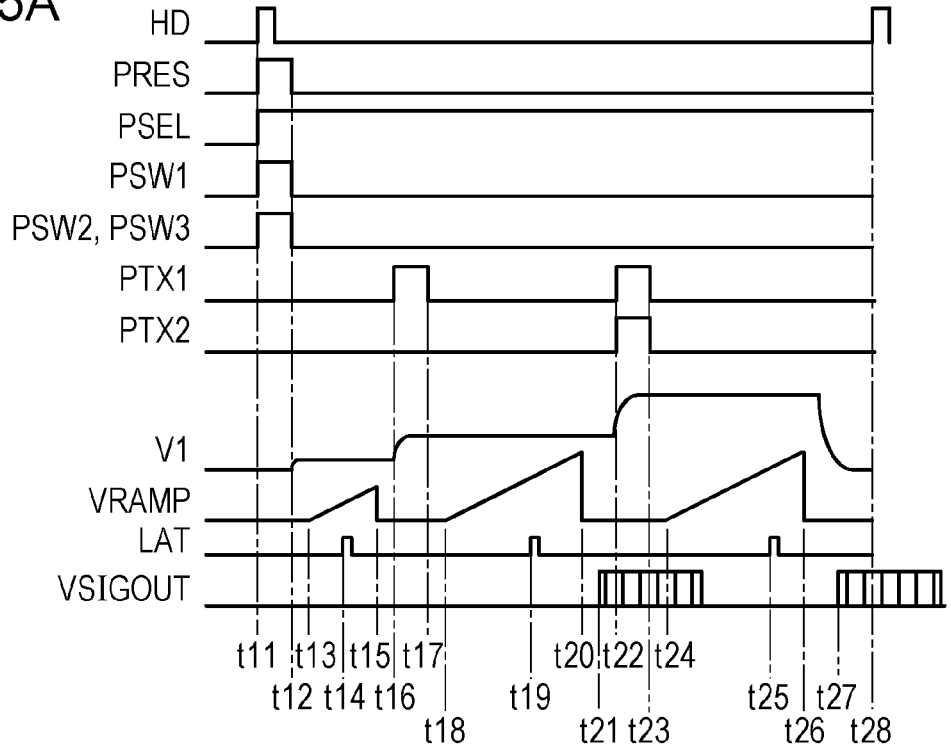
FIGS. 5A and 5B are timing charts illustrating the driving method of the photoelectric conversion apparatus according to the first embodiment.
Figure 5B:
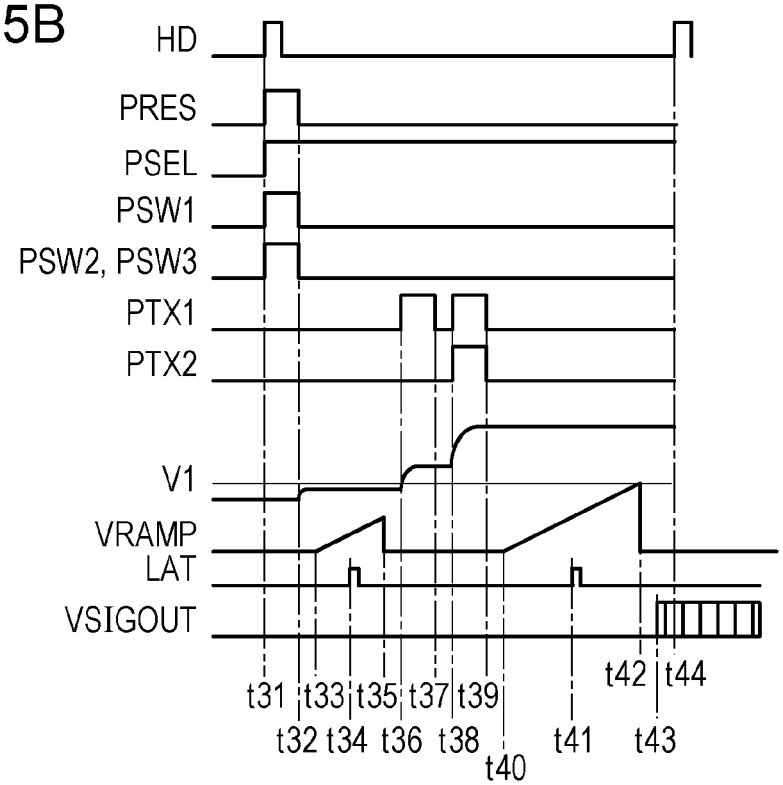

To explain the readout methods for the periods 101 and 102, a driving method will be described in detail with reference to FIGS. 5A and 5B. FIGS. 5A and 5B are timing charts illustrating the driving method of the photoelectric conversion apparatus 100 according to the first embodiment. FIG. 5A is a diagram for explaining the readout method for the period 101 (first readout method), and FIG. 5B is a diagram for explaining the readout method for the period 102 (second readout method). The period 101 is the period from time t11 to time t28 in FIG. 5A, and the period 102 is the period from time t31 to time t44 in FIG. 5B. The transfer transistors 24 and 28, the reset transistor 30, the selection transistor 34, and the switches SW1 to SW3 operate in accordance with each control signal supplied thereto in the following manner. That is, when a signal of High level (hereinafter referred to as H level) is applied as a control signal, the transistors or switches transition to a conducting (ON) state. When a signal of Low level (hereinafter referred to as L level) is applied as a control signal, the transistors or switches transition to a non-conducting (OFF) state.

In FIG. 5A, the vertical axis represents the signal HD, signal PRES, signal PSEL, signals PSW1 to PSW3, signal PTX1, signal PTX2, signal V1, signal VRAMP, signal LAT, and signal VSIGOUT, and the horizontal axis represents time. The signal PRES, signal PSEL, signal PTX1, and signal PTX2 are control signals supplied to the respective signal lines RES, SEL, TX1, and TX2 in FIG. 1. The signals PSW1 to PSW3 are control signals supplied to the respective switches SW1 to SW3 in FIG. 1. The signal V1 is an output signal of the operational amplifier 44, the signal VRAMP is a ramp signal output from the ramp signal generating circuit 15, and the signal LAT is a latch signal output from the comparator circuit 46. The signal VSIGOUT is a signal output from the signal line SIGOUT.

First, at time t11, the signal HD transitions to H level and the readout operation of reading from the pixels 20 in the first row in FIG. 4 starts. Also at time t11, in accordance with the signal HD of H level, the vertical scanning circuit 12 supplies the signal PRES of H level to the signal line RES to turn on the reset transistor 30 in each pixel 20. Thus, the FD region 36, which is an input node, is electrically connected through the reset transistor 30 to the supply voltage line, and is reset to a reset level potential. Also at time t11, the vertical scanning circuit 12 supplies the signal PSEL of H level to the signal line SEL to turn on the selection transistor 34. Thus, bias current is supplied from the current source 42 through the vertical signal line 38 and the selection transistor 34 to the source of the amplifying transistor 32, which functions as a source follower circuit. Then, a signal obtained when the FD region 36 is at the reset level potential is output through the selection transistor 34 to the vertical signal line 38. Also at time t11, the signals PSW1 to PSW3 of H level turn on the switches SW1 to SW3. When the switch SW1 is turned on, the output and input terminals of the operational amplifier 44 are brought into a short-circuited state and the operational amplifier 44 is reset. At the same time, when the switches SW2 and SW3 are turned on, the capacitors C3 and C4 are reset.

At time t12, the signal PRES is changed to L level. This turns off the reset transistor 30. Charge injection generated in the reset transistor 30 when the signal PRES transitions from H level to L level changes the potential of the input node of the amplifying transistor 32. This also changes the level of the signal output to the vertical signal line 38.

Also at time t12, the signals PSW1 to PSW3 are changed to L level. Thus, a signal based on the signal output from the pixel 20 to the vertical signal line 38 before the signals PSW1 to PSW3 transition to L level is retained in each of the capacitors C0, C3, and C4. The signal in the vertical signal line 38 is input through the capacitor C0 to the inverting input terminal of the operational amplifier 44. Thus, the operational amplifier 44 amplifies the signal and outputs the amplified signal to the capacitor C3. Since the capacitor C2 is connected to a feedback path of the operational amplifier 44, the gain is determined by the ratio between the capacitors C0 and C2. The signal output to the capacitor C3 is obtained by superimposing an offset signal Voff of the operational amplifier 44 on the signal amplified by the operational amplifier 44. Then, the signal output from the operational amplifier 44 is input through the capacitor C3 to the comparator circuit 46.

At time t13, the ramp signal generating circuit 15 starts to increase the value of the signal VRAMP. The ramp signal generating circuit 15 supplies the signal VRAMP through the capacitor C4 to the comparator circuit 46. Here, the signal VRAMP includes a ramp signal that gradually changes (increases) its voltage value with time, and is an exemplary reference signal to be compared with an analog signal in the comparator circuit 46.

The comparator circuit 46 starts a comparison between the signal input from the operational amplifier 44 through the capacitor C3 and the signal VRAMP supplied from the ramp signal generating circuit 15 through the capacitor C4. The comparator circuit 46 outputs the signal LAT, which is a signal based on the result of the comparison, to the counter circuit 48. Specifically, when the magnitude relationship between two signals being compared is reversed, the comparator circuit 46 causes the signal LAT to transition from L level to H level.

A signal CLK, which is a clock pulse, is input from the TG 14 to the counter circuit 48. When the ramp signal generating circuit 15 starts to increase the voltage value of the signal VRAMP, the counter circuit 48 starts to count signals CLK at the same time and outputs a count signal, which is a result of the counting, to the memory 50. When the signal LAT transitions to H level, the counter circuit 48 stops the counting of the signals CLK, and the memory 50 retains the count signal when the signal LAT transitions to H level.

In FIG. 5A, the magnitude relationship between the signal input from the operational amplifier 44 through the capacitor C3 and the signal VRAMP input through the capacitor C4 is reversed at time t14. Then, the comparator circuit 46 outputs the signal LAT of H level to the counter circuit 48. Upon receipt of the signal LAT of H level, the counter circuit 48 stops outputting the count signal to the memory 50. The memory 50 retains the count signal at time t14. The ramp signal generating circuit 15 stops increasing the signal VRAMP at time t15. In the present example, the counter circuit 48 stops outputting the count signal to the memory 50 upon receipt of the signal LAT of H level. Alternatively, the counter circuit 48 may be configured to stop the counting operation. This also applies to similar operations described below. That is, the counter circuit 48 may stop the operation, instead of the output, in similar operations described below.

Through the operations performed by the comparator circuit 46, the counter circuit 48, and the memory 50 in the period from time t13 to time t15, the analog signal output from the operational amplifier 44 through the capacitor C3 is converted to digital form (digital conversion). The resulting digital signals are signals N. The signals N can include at least one of a noise signal obtained when the reset transistor 30 is reset, the offset signal Voff of the operational amplifier 44, and an offset signal of the comparator circuit 46.

At time t16, the vertical scanning circuit 12 outputs the signal PTX1 of H level to turn on the transfer transistor 24. Thus, a charge generated in the PD 22 is transferred to the FD region 36. Then, a signal based on the potential of the FD region 36 corresponding to the amount of charge transferred from the PD 22 is output through the selection transistor 34 to the vertical signal line 38 and retained in the capacitor C0.

At time t17, the signal PTX1 is changed to L level. The operational amplifier 44 amplifies a signal input from the pixel 20 through the capacitor C0, and outputs the amplified signal through the capacitor C3 to the comparator circuit 46. At time t18, the ramp signal generating circuit 15 increases the signal VRAMP to be supplied through the capacitor C4 to the comparator circuit 46, and the comparator circuit 46 starts a comparison between the signal input from the operational amplifier 44 through the capacitor C3 and the signal VRAMP. As in the case of the signal N described above, when the signal level of the signal VRAMP starts to be increased, the counter circuit 48 starts to count the signals CLK at the same time.

In FIG. 5A, the magnitude relationship between the signal input from the operational amplifier 44 through the capacitor C3 and the signal VRAMP input through the capacitor C4 is reversed at time t19. After this, the same operations as those at times t14 and t15 are performed. That is, in accordance with the signal LAT of H level, the memory 50 retains the count signal at time t19 and the ramp signal generating circuit 15 stops increasing the signal VRAMP at time t20.

Through the operations performed by the comparator circuit 46, the counter circuit 48, and the memory 50 in the period from time t18 to time t20, the analog signal output from the operational amplifier 44 through the capacitor C3 is converted to digital form. The resulting digital signals are signals A which are ones of S signals. That is, the signals S include image signals and focus detection signals, and the signals A include a signal based on a charge generated in, for example, the PD 22. The signals S can further include at least one of a noise signal obtained when the reset transistor 30 is reset, the offset signal Voff of the operational amplifier 44, and an offset signal of the comparator circuit 46. The signals S include the signals A and the signals A+B (described below). In the driving method of the photoelectric conversion apparatus 100 according to the present embodiment, the signals A and the signals A+B are output in a time-sharing manner.

Next, at time t21, the signals N and the signals A retained in the memory 50 are transferred, as output signals VSIGOUT, from the memory 50 to the outside of the photoelectric conversion apparatus 100. The outside of the photoelectric conversion apparatus 100 refers to, for example, a video signal processing unit 1300 in an image pickup system 1000 (see FIG. 10) described below. The video signal processing unit 1300 may be mounted on part of the photoelectric conversion apparatus 100, that is, on the chip having the photoelectric conversion apparatus 100. In accordance with a timing signal from the TG 14, the horizontal scanning circuit 13 sequentially selects the memories 50 in each column and sequentially transfers the signals N and the signals A retained in the memories 50 in each column to the video signal processing unit 1300.

In the present embodiment, the signals N and the signals A start to be transferred to the outside of the photoelectric conversion apparatus 100 at time t20. However, this may take place after the operation at time t21 (described below). The transfer of the signals N and the signals A preferably ends by time t26 at which digital conversion of the signals A+B (described below) ends. Thus, since the transfer of the signals A+B and the signals N (described below) can be performed immediately after the end of the digital conversion of the signals A+B, the readout time can be shortened.

Next, at time t22, the vertical scanning circuit 12 supplies the signals PTX1 and PTX2 of H level to the signal lines TX1 and TX2 to turn on the transfer transistors 24 and 28. Thus, charges generated by photoelectric conversion in the PDs 22 and 26 are transferred to the FD region 36, which retains the charges from both the PDs 22 and 26. As a result, a signal based on the potential of the FD region 36 corresponding to the total amount of charges from the PDs 22 and 26 is output through the selection transistor 34 to the vertical signal line 38. Note that before time t22, a charge generated in the PD 22 by the operation at time t16 is transferred to the FD region 36.

After the pixel 20 outputs a signal through the vertical signal line 38 to the capacitor C0, the signals PTX1 and PTX2 are changed to L level at time t23. The operational amplifier 44 amplifies a signal input from the pixel 20 through the capacitor C0 and outputs the amplified signal through the capacitor C3 to the comparator circuit 46. Then at time t24, the ramp signal generating circuit 15 increases the signal VRAMP to be supplied through the capacitor C4 to the comparator circuit 46, and the comparator circuit 46 starts a comparison between the signal input from the operational amplifier 44 through the capacitor C3 and the signal VRAMP. As in the case of the signal N described above, when the signal level of the signal VRAMP starts to be increased, the counter circuit 48 starts to count the signals CLK at the same time.

In FIG. 5A, the magnitude relationship between the signal input from the operational amplifier 44 through the capacitor C3 and the signal VRAMP input through the capacitor C4 is reversed at time t25. Then, the comparator circuit 46 outputs the signal LAT of H level to the counter circuit 48. Upon receipt of the signal LAT, the counter circuit 48 stops outputting the count signal to the memory 50. The memory 50 retains the count signal at time t25. The ramp signal generating circuit 15 stops increasing the signal VRAMP at time t26.

Through the operations performed by the comparator circuit 46, the counter circuit 48, and the memory 50 in the period from time t24 to time t26, the analog signal output from the operational amplifier 44 through the capacitor C3 is converted to digital form. The resulting digital signals are the signals S and the signals A+B. A signal based on charges generated in at least the two PDs 22 and 26 is the signal A+B.

In the digital conversion for obtaining the signal N and the signal S, the period of digital conversion for obtaining the signal N is shorter than that for the signal S. Generally, this is because since the signal N mainly contains noise and offset components, the signal range of the signal N is narrower than that of the signal S. Since the period for changing the signal VRAMP can be shortened here, the period for reading out signals from the pixels 20 in each row can be shortened.

Next, at time t27, the signals N and the signals A+B are transferred, as output signals VSIGOUT, from the memory 50 to the outside of the photoelectric conversion apparatus 100 as in the operation at time t21. The outside of the photoelectric conversion apparatus 100 refers to, for example, the video signal processing unit 1300 in the image pickup system 1000 illustrated in FIG. 10. Processing performed in the video signal processing unit 1300 will be described later on. Thus, the signal (signal A) based on a charge generated in the PD 22, the signal (signal B) based on a charge generated in the PD 26, and the signal (signal A+B) based on charges generated in the PDs 22 and 26 can be acquired.

At time t28, the signal HD transitions to H level, and the readout operation of reading from the pixels 20 in the second row starts in the same procedure as above.

The readout method for the period 102 will now be described with reference to FIG. 5B. As in FIG. 5A, the vertical axis in FIG. 5B represents the signal HD, signal PRES, signal PSEL, signals PSW1 to PSW3, signal PTX1, signal PTX2, signal V1, signal VRAMP, signal LAT, and signal VSIGOUT, and the horizontal axis represents time. The same components as those in FIG. 5A are denoted by the same reference numerals and their description will be omitted.

The operations performed in the period from time t31 to time t35 in FIG. 5B are the same as those performed in the period from time t11 to time t15 in FIG. 5A, and the same signals N are read out in these periods. The operations performed in the period from time t38 to time t44 in FIG. 5B are the same as those performed in the period from time t22 to time t28 in FIG. 5A, and the same signals A+B are read out in these periods.

In FIG. 5B, the operation performed in the period from time t16 to time t21 (i.e., the operation of reading out the signals A) in FIG. 5A is not performed. In FIG. 5B, the signal PTX1 is changed to H level at time t36, and is changed to L level at time t37. First, at time t36, the transfer pulse signal PTX1 is changed to H level to turn on the transfer transistor 24. Thus, a charge generated by photoelectric conversion in the PD 22 is transferred to the input node of the amplifying transistor 32, that is, to the FD region 36. As a result, a signal based on the potential of the input node of the amplifying transistor 32 corresponding to the total amount of charge from the PD 22 (i.e., signal A) is output through the selection transistor 34 to the vertical signal line 38. Then, the signal PTX1 is changed to L level at time t37. That is, before the operation at time t38, the gate voltage of the amplifying transistor 32 and the potential of the vertical signal line 38 reach levels corresponding to the total amount of charge from the PD 22, and this condition is the same as that before the operation at time t22 in FIG. 5A. Thus, since the conditions of the transfer operations can thus be brought close to each other, image signals can be read out with less variation between the readout operation in the period 101 and the readout operation in the period 102.

Since the operations in the period from time t36 to time t37 are performed to bring the conditions of the transfer operations close to each other, there is no need to read out signals output in accordance with these operations to the outside of the photoelectric conversion apparatus 100. The signal processing circuit 40 may be configured not to retain the signal A output from the amplifying transistor 32. Alternatively, the amplifying transistor 32 may be configured not to output the signal A by turning off the selection transistor 34 in the period from time t36 to time t37.

By performing the readout operations in FIGS. 5A and 5B in the periods 101 and 102 illustrated in FIG. 4, it is possible to reduce variation in image signals while reading out image signals and focus detection signals.

As described above, to acquire only the signals A+B in the present embodiment, a charge transfer in the readout operation is performed for the signals A which are not actually read out. Thus, the potential of the FD region 36 in the operation in FIG. 5A can be made the same as that in the operation in FIG. 5B. Therefore, it is possible to reduce variation in image signals between the case of reading out only the signals A+B and the case of reading out the signals A and the signals A+B.

Also, the total number of times the transfer transistors 24 and 28 are driven by the corresponding control signals supplied thereto (i.e., the total number of times the control signals transition to H level) in the operation in FIG. 5A can be made the same as that in the operation in FIG. 5B. Specifically, in FIG. 5A, the total number of times the transfer transistors 24 and 28 are driven by the corresponding control signals is three; that is, the transfer transistor 24 is driven by the signal PTX1 at time t16 and time t22 and the transfer transistor 28 is driven by the signal PTX2 at time t22. In FIG. 5B, the total number of times the transfer transistors 24 and 28 are driven by the corresponding control signals is also three; that is, the transfer transistor 24 is driven by the signal PTX1 at time t36, and the transfer transistors 24 and 28 are driven by the signals PTX1 and PTX2, respectively, at time t38. With this operation, for example, it is possible to reduce variation in noise resulting from switching of the transfer transistors 24 and 28 caused by signal transitions to H level and L level. It is possible to reduce a difference between noise superimposed on a second signal acquired by the first readout method and noise superimposed on a second signal acquired by the second readout method. Therefore, it is possible to reduce variation between image signals acquired by the two readout methods.

Although one pixel includes two photoelectric conversion elements in the present embodiment described above, the present embodiment is not limited to this. It is only necessary in the present embodiment that a plurality of photoelectric conversion elements be included in one pixel. For example, each of pixels includes four photoelectric conversion elements, and a first pixel (which is one of the pixels) reads out a signal from only one or more of the four photoelectric conversion elements and reads out a charge obtained by adding up charges from the respective four photoelectric conversion elements. Also, a second pixel (which is another of the pixels) reads out a charge obtained by adding up charges from the respective four photoelectric conversion elements. In this case, the number of times a charge from one of the four photoelectric conversion elements is transferred to the FD region 36 during the period from when the reset of the FD region 36 is released until when the charge obtained by adding up charges from the four photoelectric conversion elements is transferred to the FD region 36 in the second pixel needs to be the same as the number of times a charge from one of the four photoelectric conversion elements is transferred to the FD region 36 during the period from when the reset of the FD region 36 is released until when the charge obtained by adding up charges from the four photoelectric conversion elements is transferred to the FD region 36 in the first pixel.

Second Embodiment

A driving method of the photoelectric conversion apparatus according to a second embodiment will be described with reference to FIG. 6. FIG. 6 is a timing chart illustrating a driving method of the photoelectric conversion apparatus. FIG. 6 corresponds to FIG. 4 of the first embodiment. In FIG. 6, the same components as those in the photoelectric conversion apparatus and the driving method thereof according to the first embodiment are denoted by the same reference numerals, and their description will be omitted.

In the driving method of the photoelectric conversion apparatus according to the second embodiment, unlike the driving method of the photoelectric conversion apparatus according to the first embodiment, a signal readout operation for the periods 102 is performed after completion of a signal readout operation for the periods 101 in all rows (from the 1st to 16th rows). Specifically, the focus detection signals are read out in one frame period (frame A), that is, in the period from time t50 at which the signal VD transitions to H level to time t53 at which the signal VD subsequently transitions to H level. Then, the image signals are read out in another frame period (frame B) starting at time t53.

A period for reading out image signals, that is, a frame rate at which the operation for the frame B is performed corresponds to the frame speed of still images or moving images. Moving images need to be read out at a standard of 60 frames per second (fps) or 30 fps. However, a period for reading out focus detection signals, that is, a frame rate at which the operation for the frame A is performed may be any period used to perform autofocusing, and does not need to correspond to the operation for the frame B. Therefore, the operation for the periods 102 can be performed in the frame B and the operation for the periods 101 can be performed in the frame A.

When signals are read out in different frames as described above, the resulting variation in image signals between the frames A and B causes a level difference in a plurality of images. Such a level difference affects the continuity of still images or moving images. Therefore, in the second embodiment, the readout method for the period 102 illustrated in FIG. 5B is also performed in the frame B, so that the levels of signals A+B read out by different readout methods can be made the same. That is, the first readout method and the second readout method can be applied either to each of different pixels in one frame or to the same pixel in each of different frames.

Third Embodiment

A driving method of the photoelectric conversion apparatus according to a third embodiment will be described with reference to FIGS. 7A and 7B and FIGS. 8A and 8B. FIGS. 7A and 7B are timing charts illustrating a driving method of the photoelectric conversion apparatus. In the third embodiment, the same components as those in the photoelectric conversion apparatus and the driving method thereof according to the first embodiment are denoted by the same reference numerals and their description will be omitted.

FIG. 7A corresponds to FIG. 4 and is a timing chart illustrating a driving method of the photoelectric conversion apparatus. Specifically, FIG. 7A is a timing chart extracting the first to sixth rows in FIG. 4. The third embodiment differs from the first embodiment in that it has a reset period including periods 103 and 104 before the readout period including the periods 101 and 102. In the reset period, a reset operation for the period 104 is performed in the first, second, fourth, and fifth rows, whereas a reset operation for the period 103 is performed in the third and sixth rows. Then, from time t74, the operation at time t50 or t53 in FIG. 4 is performed. The reset period and the readout period can be simultaneously set, for example, as illustrated in the period from time t74 to time t82.

FIG. 7B is a timing chart illustrating the operation of the transfer transistors 24 and 28 in each period in FIG. 7A. In FIG. 7B, reference character A corresponds to the signal PTX1, and reference character A+B corresponds to the signal PTX1 and the signal PTX2. As illustrated in FIG. 7B, for example, in the period 104 from time t70 to time t73, A transitions to H level at time t71, and A+B transitions to H level at time t72. That is, the signal PTX1 transitions to H level at time t71, and the signal PTX1 and the signal PTX2 transition to H level at time t72. In the period 102 from the time t74 to time t77, A transitions to H level at time t75, and A+B transitions to H level at time t76. That is, the signal PTX1 transitions to H level at time t75, and the signal PTX1 and the signal PTX2 transition to H level at time t76. The period of accumulation of A+B signals in the first row is from time at which A+B of H level at time t72 transitions to L level to time at which A+B of H level at time t76 transitions to L level. In the period 103 from time t78 to time t81, A transitions to H level at time t79, and A+B transitions to H level at time t80. That is, the signal PTX1 transitions to H level at time t79, and the signal PTX1 and the signal PTX2 transition to H level at time t80. Then, in the period 101 from time t82 to time t85, A transitions to H level at time t83, and A+B transitions to H level at time t84. That is, the signal PTX1 transitions to H level at time t83, and the signal PTX1 and the signal PTX2 transition to H level at time t84. The period of accumulation of A+B signals in the third row is from time at which A+B of H level at time t80 transitions to L level to time at which A+B of H level at time t84 transitions to L level. The period 103 is longer than the period 104. This is because a reset operation in the period 103 takes the same length of time as that required for the signal readout operation in the period 101.

A reset operation is possible as long as a transition of A+B takes place in the reset period. However, in the present embodiment, A (signal PTX1) transitions to H level in the period 103 to turn on the gate of the transfer transistor 24. By driving the gate in the period 103 as in the period 101, the conditions of the FD region 36 in different periods can be brought close to each other, and a noise component generated by driving the gate and superimposed on the signal S can also be given to the signal N. Therefore, when a difference between the signal S and the signal N is taken, noise variation and signal variation can be reduced. As in the period 102, A transitions to H level in the period 104. With this operation, it is possible not only to reduce variation between the period 104 and the period 102, but also to reduce noise variation when a difference between the signal S acquired in the period 102 and the signal N acquired in the period 104 is taken.

Thus, since the total number of times the transfer transistors 24 and 28 are driven in the reset period is the same as that in the readout period, variation between noise superimposed on the signal S and noise superimposed on the signal N can be reduced. It is also possible to reduce variation between signals N.

Figure 8A:
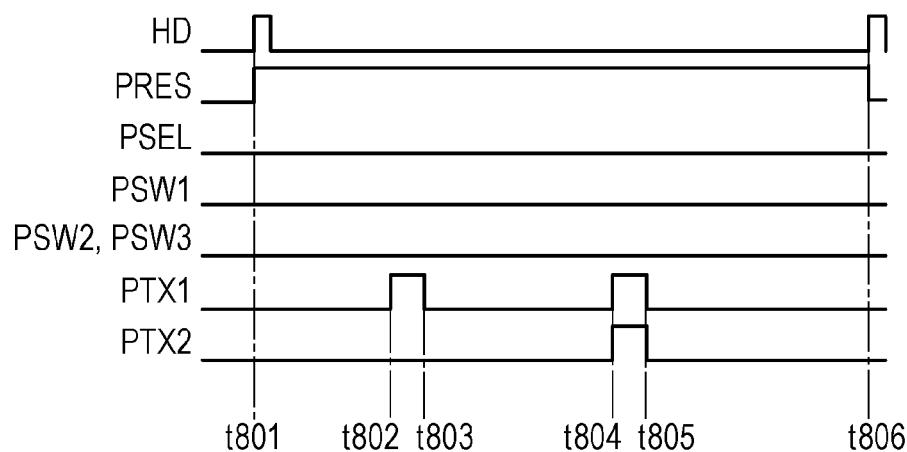
FIGS. 8A and 8B are timing charts illustrating the driving method of the photoelectric conversion apparatus according to the third embodiment.
Figure 8B:
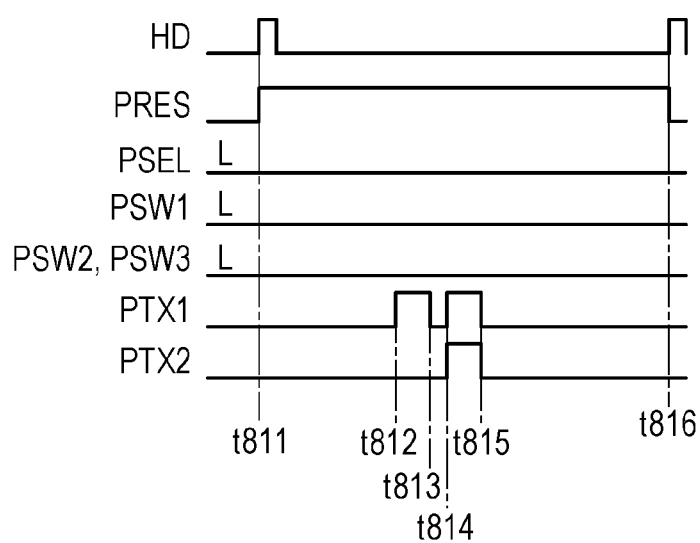

The operations in the period 103 and the period 104 will now be described in detail with reference to FIGS. 8A and 8B. FIGS. 8A and 8B are timing charts illustrating a driving method of the photoelectric conversion apparatus according to the third embodiment. FIG. 8A is a timing chart for explaining a reset method for the period 103, and FIG. 8B is a timing chart for explaining a reset method for the period 104. FIGS. 8A and 8B correspond to FIGS. 5A and 5B. Reference numerals used in FIGS. 8A and 8B will not be described here, as they are the same as those in FIGS. 5A and 5B.

In FIG. 8A, the signal HD transitions to H level at time t801 and the readout operation of reading from the pixels 20 in the first row in FIG. 7A starts. Also, the signal PRES transitions to H level at time t801 and is kept at H level until time t806. The signal PTX1 transitions to H level at time t802, and transitions to L level at time t803. This operation resets the PD 22. Next, the signals PTX1 and PTX2 transition to H level at time t804, and transition to L level at time t805. This operation resets the PDs 22 and 26. The PDs 22 and 26 and the FD region 36 are reset by performing the above-described operations in the period 103.

Similarly, in FIG. 8B, the signal HD transitions to H level at time t811 and the readout operation of reading from the pixels 20 in the first row in FIG. 7A starts. Also, the signal PRES transitions to H level at time t811 and is kept at H level until time t816. The signal PTX1 transitions to H level at time t812, and transitions to L level at time t813. This operation resets the PD 22. Next, the signals PTX1 and PTX2 transition to H level at time t814, and transition to L level at time t815. This operation resets the PDs 22 and 26. The PDs 22 and 26 and the FD region 36 are reset by performing the above-described operations in the period 104.

In the operation where the reset period is set before the readout period as described above, it is possible to reduce an image level difference between image information in the case of acquiring both focus detection information and image information, and image information in the case of acquiring only image information.

Fourth Embodiment

Figure 9:
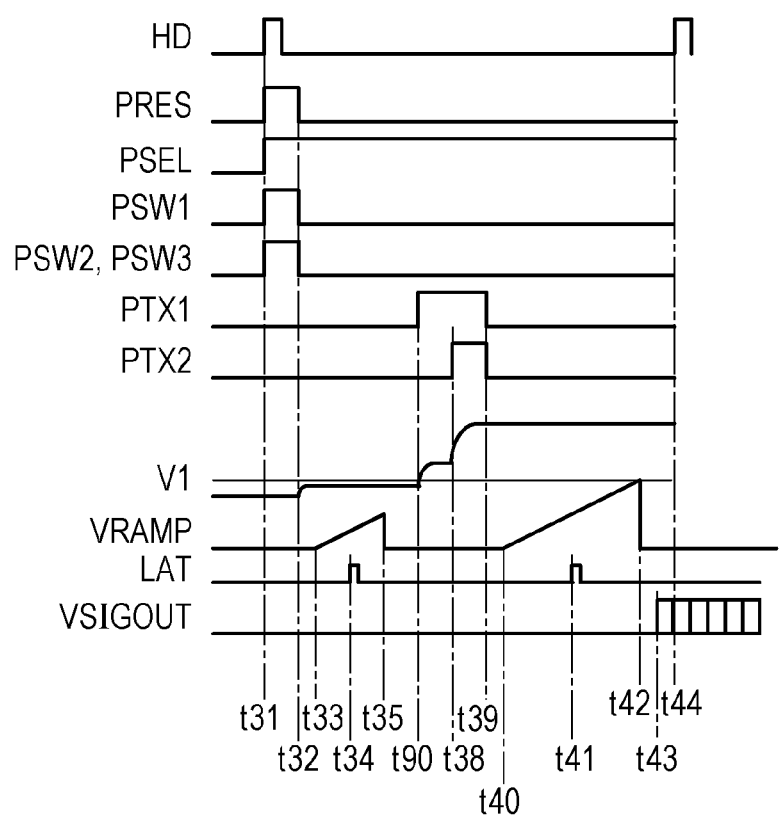
FIG. 9 is a timing chart illustrating a driving method of the photoelectric conversion apparatus according to a fourth embodiment.

A driving method of the photoelectric conversion apparatus according to a fourth embodiment will be described with reference to FIG. 9. FIG. 9 is a timing chart illustrating a driving method of the photoelectric conversion apparatus. FIG. 9 corresponds to FIG. 5B and differs therefrom in the operation of the signal PTX1. In the fourth embodiment, the same components as those in the photoelectric conversion apparatus and the driving method thereof according to the first embodiment are denoted by the same reference numerals and their description will be omitted.

In FIG. 5B, the signal PTX1 transitions to H level twice, at time t36 and time t38. In FIG. 9, however, the signal PTX1 transitions to H level at time t90 and is kept at H level until time t40. The signal PTX1 transitions to H level before the signal PTX2 transitions to H level at time t38. This can make the potential of the FD region 36 substantially the same as that before time t22 in FIG. 5A. Thus, transfer characteristics in the charge transfer operation of the photoelectric conversion elements at time t38 can be made the same as those in the readout method in FIG. 5A. Also, by making the length of the period from time t90 to time t40 in FIG. 9 the same as that of the period from time t16 to time t17 and the period from time t22 to time t24 in FIG. 5A, the amount of noise generated when the signal PTX1 is at H level can be made uniform. Thus, by the operation in FIG. 9, the amount of noise caused by transfer pulses generated in the readout method in FIG. 5A can be made uniform.

Uniform image signals can be acquired either by the readout method of the fourth embodiment or by the combination of the readout method for reading out focus detection signals and image signals and the readout method for reading out image signals.

Description of Image Pickup System

Figure 10:
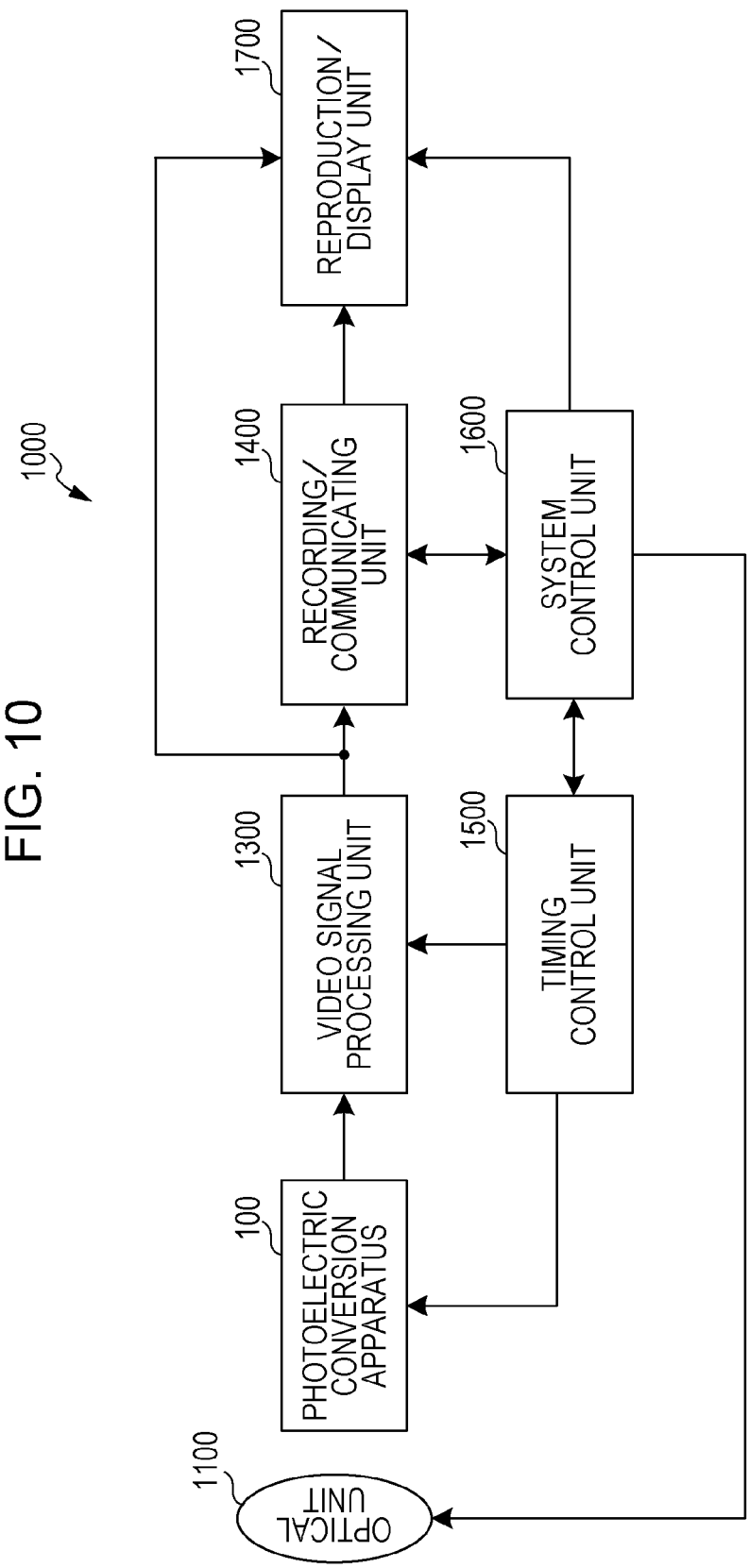
FIG. 10 is a schematic diagram illustrating a configuration of an image pickup system.

FIG. 10 is a schematic diagram illustrating a configuration of an image pickup system. The image pickup system is, for example, a camera or a distance measuring apparatus. Examples of the image pickup system include not only devices primarily intended to perform an imaging operation, but also include devices (e.g., personal computers, mobile terminals) having an imaging function as their auxiliary function.

The image pickup system 1000 according to the present embodiment includes, for example, an optical unit 1100, the photoelectric conversion apparatus 100, the video signal processing unit 1300, a recording/communicating unit 1400, a timing control unit 1500, a system control unit 1600, and a reproduction/display unit 1700. The optical unit 1100, which is an optical system such as a lens, focuses light from an object onto the pixel array 10 having a plurality of pixels 20 arranged in a two-dimensional matrix in the photoelectric conversion apparatus 100, so as to form an image of the object. At timing based on a signal from the timing control unit 1500, the photoelectric conversion apparatus 100 outputs signals corresponding to the light focused onto the pixel array 10. The signals output from the photoelectric conversion apparatus 100 are input to the video signal processing unit 1300, which processes the signals in accordance with a method defined by a program or the like. The signals processed by the video signal processing unit 1300 are transmitted as image data to the recording/communicating unit 1400. The recording/communicating unit 1400 transmits signals for forming an image to the reproduction/display unit 1700, which reproduces or displays a moving image or a still image. The recording/communicating unit 1400 not only communicates with the system control unit 1600 in response to signals from the video signal processing unit 1300, but also records signals for forming an image in a recording medium (not shown).

The video signal processing unit 1300 is capable of performing the following processing by using signals N, signals A, and signals A+B read out in the embodiments described above. For example, the video signal processing unit 1300 is capable of performing subtraction processing between the signal A and the signal N, subtraction processing between the signal A+B and the signal N, and processing of taking the difference between the signal A+B and the signal A to obtain the signal B. Here, the signal B is a digital signal based on the potential of the FD region 36 corresponding to the amount of charge retained by the PD 26 alone. The video signal processing unit 1300 is also capable of performing focus detection by the phase difference detection method using the signals A and the signals B, and forming an image using the signals A+B. Noise components superimposed on the signal A and the signal A+B can be reduced by subtracting the signal N from each of the signal A and the signal A+B (correlated double sampling). The noise components are generated, for example, by the transfer operation or the reset operation of the pixel 20, or the reset operation or the offset of the operational amplifier 44.

The system control unit 1600 controls the overall operation of the image pickup system 1000, and controls the drive of the optical unit 1100, the timing control unit 1500, the recording/communicating unit 1400, and the reproduction/display unit 1700. The system control unit 1600 includes, for example, a storage device (not shown) which is a recording medium, in which a program necessary for controlling the operation of the image pickup system 1000 is recorded. Within the image pickup system 1000, the system control unit 1600 supplies, for example, a signal for switching the readout method in accordance with the user's operation. Examples of the signal supplied by the system control unit 1600 include a signal for changing the row to be read out or reset, a signal for changing the angle of view in accordance with electronic zooming, a signal for shifting the angle of view in accordance with electronic image stabilization, and a signal for switching the readout method according to any one of the first to fourth embodiments. The system control unit 1600 controls the operation of the photoelectric conversion apparatus 100 which involves, for example, reading out focus detection signals or reading out only image signals. The timing control unit 1500 controls the timing of driving the photoelectric conversion apparatus 100 and the video signal processing unit 1300 under the control of the system control unit 1600.

Thus, by configuring the image pickup system 1000 using the photoelectric conversion apparatus 100 according to any one of the first to fourth embodiments, a high-performance image pickup system can be realized. The video signal processing unit 1300 and the timing control unit 1500 in the image pickup system 1000 may be included in the photoelectric conversion apparatus 100.

With the present invention, it is possible to reduce variation between image signals acquired by two different readout methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-224750 filed Nov. 4, 2014, which is hereby incorporated by reference herein in its entirety.

What is claimed is:

1. A photoelectric conversion apparatus comprising:
   a first pixel and a second pixel each having
      a first photoelectric conversion element;
      a second photoelectric conversion element;
      an amplifying unit having an input node and configured to read out a signal based on charges generated in the first photoelectric conversion element and the second photoelectric conversion element;
      a first transfer gate configured to transfer the charge generated in the first photoelectric conversion element to the input node;
      a second transfer gate configured to transfer the charge generated in the second photoelectric conversion element to the input node; and
      a microlens configured to condense incident light onto the first photoelectric conversion element and the second photoelectric conversion element,
   wherein the photoelectric conversion apparatus performs a first operation in which, in the first pixel, the first transfer gate is turned on to transfer the charge generated in the first photoelectric conversion element to the input node, a signal based on the charge generated in the first photoelectric conversion element is output from the photoelectric conversion apparatus, the first transfer gate and the second transfer gate are turned on while the charge generated in the first photoelectric conversion element and transferred to the input node is retained in the input node to transfer the charges generated in the first photoelectric conversion element and the second photoelectric conversion element to the input node, and a signal based on the charges generated in the first photoelectric conversion element and the second photoelectric conversion element is output from the photoelectric conversion apparatus; and
   the photoelectric conversion apparatus performs a second operation in which, in the second pixel, the first transfer gate is turned on to transfer the charge generated in the first photoelectric conversion element to the input node, a signal based on the charge generated in the first photoelectric conversion element is not output from the photoelectric conversion apparatus, the first transfer gate and the second transfer gate are turned on while the charge generated in the first photoelectric conversion element and transferred to the input node is retained in the input node to transfer the charges generated in the first photoelectric conversion element and the second photoelectric conversion element to the input node, and a signal based on the charges generated in the first photoelectric conversion element and the second photoelectric conversion element is output from the photoelectric conversion apparatus.

2. The photoelectric conversion apparatus according to claim 1, wherein in the second operation, after the first transfer gate is turned on, the first transfer gate is turned off before the first transfer gate and the second transfer gate are turned on.

3. The photoelectric conversion apparatus according to claim 1, wherein a total number of times the first and second transfer gates are turned on in the first operation is the same as a total number of times the first and second transfer gates are turned on in the second operation.

4. The photoelectric conversion apparatus according to claim 1, wherein in the second operation, after the first transfer gate is turned on, the second transfer gate is turned on while the first transfer gate is kept in an on-state.

5. The photoelectric conversion apparatus according to claim 1, wherein the first operation and the second operation are performed in one frame period.

6. The photoelectric conversion apparatus according to claim 1, wherein the first operation is performed in a first frame period, and the second operation is performed in a second frame period.

7. The photoelectric conversion apparatus according to claim 1, wherein a signal read out by the first operation, the signal being based on the charges generated in the first photoelectric conversion element and the second photoelectric conversion element, and a signal read out by the second operation, the signal being based on the charges generated in the first photoelectric conversion element and the second photoelectric conversion element, form a single image.

8. The photoelectric conversion apparatus according to claim 1, wherein the first pixel and the second pixel each include a reset unit, and have a reset operation in which, after the first transfer gate is turned on while the reset unit is kept in an on-state, the first transfer gate and the second transfer gate are turned on.

9. The photoelectric conversion apparatus according to claim 1, further comprising a signal processing circuit to which a signal output by the amplifying unit is input,
wherein in the second operation, the first transfer gate is turned on and a signal based on the charge generated in the first photoelectric conversion element is output from the amplifying unit to the signal processing circuit; and
the signal processing circuit turns on the first transfer gate, and does not retain the signal based on the charge generated in the first photoelectric conversion element.

10. The photoelectric conversion apparatus according to claim 1, wherein the first pixel and the second pixel each include a monochromatic color filter between the microlens and the first and second photoelectric conversion elements.

11. An image pickup system comprising:
a photoelectric conversion apparatus; and
a processing unit configured to process signals from the photoelectric conversion apparatus,
the photoelectric conversion apparatus comprising:
a first pixel and a second pixel each having
a first photoelectric conversion element;
a second photoelectric conversion element;
an amplifying unit having an input node and configured to read out a signal based on charges generated in the first photoelectric conversion element and the second photoelectric conversion element;
a first transfer gate configured to transfer the charge generated in the first photoelectric conversion element to the input node;
a second transfer gate configured to transfer the charge generated in the second photoelectric conversion element to the input node; and
a microlens configured to condense incident light onto the first photoelectric conversion element and the second photoelectric conversion element,
wherein the photoelectric conversion apparatus performs a first operation in which, in the first pixel, the first transfer gate is turned on to transfer the charge generated in the first photoelectric conversion element to the input node, a signal based on the charge generated in the first photoelectric conversion element is output from the photoelectric conversion apparatus, the first transfer gate and the second transfer gate are turned on while the charge generated in the first photoelectric conversion element and transferred to the input node is retained in the input node to transfer the charges generated in the first photoelectric conversion element and the second photoelectric conversion element to the input node, and a signal based on the charges generated in the first photoelectric conversion element and the second photoelectric conversion element is output from the photoelectric conversion apparatus; and
the photoelectric conversion apparatus performs a second operation in which, in the second pixel, the first transfer gate is turned on to transfer the charge generated in the first photoelectric conversion element to the input node, a signal based on the charge generated in the first photoelectric conversion element is not output from the photoelectric conversion apparatus, the first transfer gate and the second transfer gate are turned on while the charge generated in the first photoelectric conversion element and transferred to the input node is retained in the input node to transfer the charges generated in the first photoelectric conversion element and the second photoelectric conversion element to the input node, and a signal based on the charges generated in the first photoelectric conversion element and the second photoelectric conversion element is output from the photoelectric conversion apparatus.

12. The image pickup system according to claim 11, wherein in the second operation, after the first transfer gate is turned on, the first transfer gate is turned off before the first transfer gate and the second transfer gate are turned on.

13. The image pickup system according to claim 11, wherein a total number of times the first and second transfer gates are turned on in the first operation is the same as a total number of times the first and second transfer gates are turned on in the second operation.

14. The image pickup system according to claim 11, wherein in the second operation, after the first transfer gate is turned on, the second transfer gate is turned on while the first transfer gate is kept in an on-state.

15. The image pickup system according to claim 11, wherein the first operation and the second operation are performed in one frame period.

16. The image pickup system according to claim 11, wherein the first operation is performed in a first frame period, and the second operation is performed in a second frame period.

17. The image pickup system according to claim 11, wherein a signal read out by the first operation, the signal being based on the charges generated in the first photoelectric conversion element and the second photoelectric conversion element, and a signal read out by the second operation, the signal being based on the charges generated in the first photoelectric conversion element and the second photoelectric conversion element, form a single image.

18. The image pickup system according to claim 11, wherein the first pixel and the second pixel each include a reset unit, and have a reset operation in which, after the first transfer gate is turned on while the reset unit is kept in an on-state, the first transfer gate and the second transfer gate are turned on.

19. The image pickup system according to claim 11, wherein the photoelectric conversion apparatus further comprises a signal processing circuit to which a signal output by the amplifying unit is input, wherein in the second operation, the first transfer gate is turned on and a signal based on the charge generated in the first photoelectric conversion element is output from the amplifying unit to the signal processing circuit, and the signal processing circuit turns on the first transfer gate, and does not retain the signal based on the charge generated in the first photoelectric conversion element.

20. The image pickup system according to claim 11, wherein the first pixel and the second pixel each include a monochromatic color filter between the microlens and the first and second photoelectric conversion elements.

* * * * *